(12) United States Patent
Swoboda

(10) Patent No.: US 6,947,884 B2
(45) Date of Patent: Sep. 20, 2005

(54) SCAN INTERFACE WITH TDM FEATURE FOR PERMITTING SIGNAL OVERLAY

(75) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 915 days.

(21) Appl. No.: 09/798,595

(22) Filed: Mar. 2, 2001

(65) Prior Publication Data

US 2001/0034598 A1 Oct. 25, 2001

Related U.S. Application Data

(60) Provisional application No. 60/186,326, filed on Mar. 2, 2000, and provisional application No. 60/219,340, filed on Mar. 2, 2000.

(51) Int. Cl.⁷ ............................................. G06F 9/455
(52) U.S. Cl. ............................. 703/28; 703/23; 703/27; 714/726; 714/727; 714/729
(58) Field of Search ............................. 703/27, 28, 23; 714/729, 726, 727

(56) References Cited

U.S. PATENT DOCUMENTS 5,056,093 A * 10/1991 Whetsel ...................... 714/729
5,347,523 A    9/1994 Khatri et al.
5,828,824 A   10/1998 Swoboda ................ 395/183.01
5,835,503 A * 11/1998 Jones et al. .................. 714/719
5,898,701 A *  4/1999 Johnson ...................... 714/726
5,943,490 A    8/1999 Sample

FOREIGN PATENT DOCUMENTS

GB           2 218 816 A      11/1989

OTHER PUBLICATIONS

ARM Limited, RDI 1.5.1tx and RDI 1.5.1rt; May 19, 2000; pp. 1–55.
ARM Limited, ETM9, Rev. 1, Technical Reference Manual, pp. 1–Index–3.
ARM Limited, Embedded Trace Macrocell, Rev. 1, Specification, pp. i–Index–3.

* cited by examiner

Primary Examiner—Thai Phan
Assistant Examiner—Herng-der Day
(74) Attorney, Agent, or Firm—Robert D. Marshall, Jr.; W. James Brady, III; Frederick J. Telecky, Jr.

(57) ABSTRACT

A scan interface that includes control signals (TRST, TMS, TCK) and data signals (TDI, TDO) normally carried by respective signal paths of the scan interface can be used to carry signals other than signals of the scan interface. A first signal (TMS) and a second signal (TDO) can be time division multiplexed on the signal path that normally carries one of the signals, thereby freeing the signal path that carries the other of the signals to carry a signal other than a signal of the scan interface.

10 Claims, 18 Drawing Sheets

| FORMAT | DESCRIPTION |
|---|---|
| J_1 | THE SCAN CONTROLLER USES NONE OF THE PINS LABELED TMS, TDO AND TDI AND TCK. TCK, TMS, TDO AND TDI ARE UNUSED FOR SCAN AND CAN BE ASSIGNED TO OTHER DEBUG FUNCTIONS. |
| J_3 | THE SCAN PROTOCOL USES THE 3 PINS LABELED TCK, TRST AND TDI. TARGET TMS AND TDI ARE UNUSED AND CAN BE ASSIGNED TO OTHER DEBUG FUNCTIONS. THE CONTROLLER TDI AND CHIP TDO ARE USED AS A BI-DIRECTIONAL SIGNAL THAT COMMUNICATE MODE OUTPUT AND DATA OUTPUT TO THE TARGET FROM THE EMULATOR AND DATA OUTPUT FROM THE TARGET TO THE EMULATOR. TCK AND TRST ARE USED FOR THEIR NORMAL GLOBAL JTAG FUNCTIONS. |
| J_4 | THE SCAN CONTROLLER USES THE 4 PINS LABELED TCK, TRST, TDO AND TDI. TMS IS UNUSED AND CAN BE ASSIGNED TO OTHER DEBUG FUNCTIONS. CONTROLLER TDO IS USED TO SEND MULTIPLEXED MODE AND DATA OUTPUT TO THE TARGET TDI. TARGET TDO SUPPLIES CONTROLLER TDI WITH THE TARGET GENERATED SCAN DATA. TCK AND TRST ARE USED FOR THEIR NORMAL GLOBAL JTAG FUNCTIONS. |
| J_5 | THE 5 CONTROLLER AND TARGET PINS LABELED TCK, TRST, TMS, TDO, TDI ARE USED TO IMPLEMENT THE STANDARD JTAG PROTOCOL. THE CONTROLLER TMS IS USED TO BROADCAST MODE INFORMATION TO A CHIP OR CHIPS TMS. THE CONTROLLER TDO IS USED TO SEND CONTROLLER GENERATED SCAN DATA OUTPUT TO A TARGET CHIP'S TDI. A TARGET CHIP'S TDO SUPPLIES THE CONTROLLER TDI WITH THE CHIP GENERATED SCAN DATA. TCK AND TRST ARE USED FOR THEIR NORMAL GLOBAL JTAG FUNCTIONS. |

*FIG. 3*

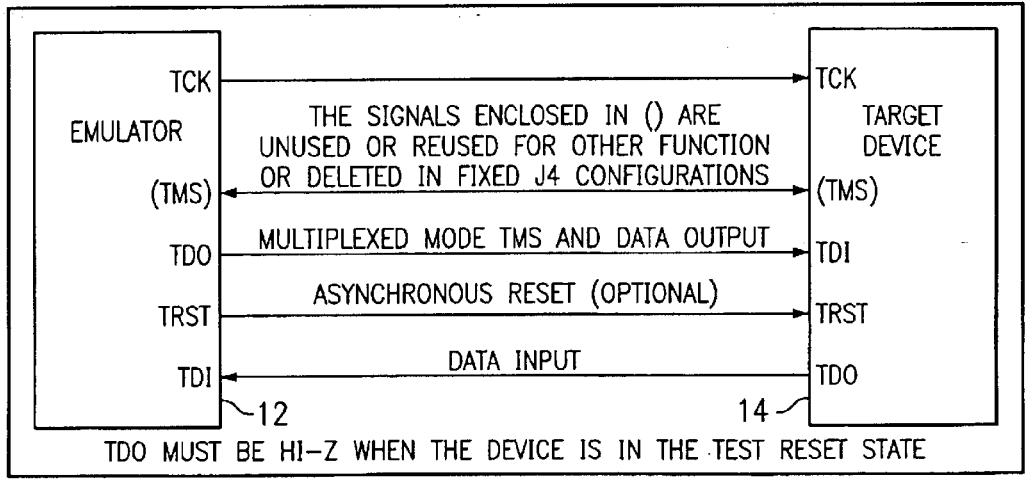

*FIG. 4*

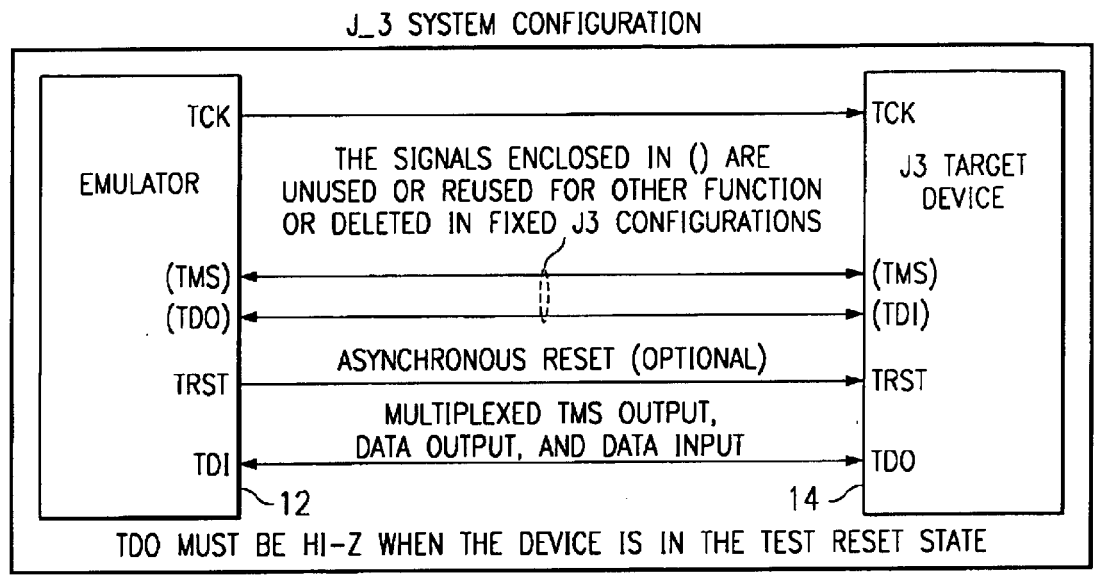

FIG. 5

| STATE | TARGET TDI PIN | DESCRIPTION | TARGET TDO PIN | DESCRIPTION |
|---|---|---|---|---|
| 0xF | 0 | START BIT | TDO_0 | TEST DATA OUT 0 |
| 0x0 | TMS_0 | TEST MODE SELECT 0 | TDO_0 | TEST DATA OUT 0 |
| 0x1 | TMS_1 | TEST MODE SELECT 1 | TDO_0 | TEST DATA OUT 0 |
| 0x2 | TMS_2 | TEST MODE SELECT 2 | TDO_0 | TEST DATA OUT 0 |
| 0x3 | TMS_3 | TEST MODE SELECT 3 | TDO_0 | TEST DATA OUT 0 |
| 0x4 | TDI_0 | TEST DATA INPUT 0 | TDO_0 | TEST DATA OUT 0 |
| 0x5 | TDI_1 | TEST DATA INPUT 1 | TDO_1 | TEST DATA OUT 1 |
| 0x6 | TDI_2 | TEST DATA INPUT 2 | TDO_2 | TEST DATA OUT 2 |
| 0x7 | TDI_3 | TEST DATA INPUT 3 | TDO_3 | TEST DATA OUT 3 |
| 0xF | 0 | START BIT | TDO_4 | TEST DATA OUT 4 |
| 0x0 | TMS_4 | TEST MODE SELECT 4 | TDO_4 | TEST DATA OUT 4 |
| 0x1 | TMS_5 | TEST MODE SELECT 5 | TDO_4 | TEST DATA OUT 4 |
| 0x2 | TMS_6 | TEST MODE SELECT 6 | TDO_4 | TEST DATA OUT 4 |
| 0x3 | TMS_7 | TEST MODE SELECT 7 | TDO_4 | TEST DATA OUT 4 |
| 0x4 | TDI_4 | TEST DATA INPUT 4 | TDO_4 | TEST DATA OUT 4 |
| 0x5 | TDI_5 | TEST DATA INPUT 5 | TDO_5 | TEST DATA OUT 5 |
| 0x6 | TDI_6 | TEST DATA INPUT 6 | TDO_6 | TEST DATA OUT 6 |
| 0x7 | TDI_7 | TEST DATA INPUT 7 | TDO_7 | TEST DATA OUT 7 |
| 0xF | 0 | START BIT | TDO_8 | TEST DATA OUT 8 |

FIG. 6

| | STATE | TDO PIN | | DESCRIPTION |
|---|---|---|---|---|
| TIME | | CONTROLLER | DEVICE | |
| ↓ | 0x0 | 0 | HI-z | START BIT |
| | 0x1 | TMS_0 | HI-z | TEST MODE SELECT ZERO |
| | 0x2 | TMS_1 | HI-z | TEST MODE SELECT ONE |
| | 0x3 | TMS_2 | HI-z | TEST MODE SELECT TWO |
| | 0x4 | TMS_3 | HI-z | TEST MODE SELECT THREE |
| | 0x5 | TDI_0 | HI-z | TEST DATA INPUT ZERO |
| | 0x6 | TDI_1 | HI-z | TEST DATA INPUT ONE |
| | 0x7 | TDI_2 | HI-z | TEST DATA INPUT TWO |
| | 0x8 | TDI_3 | HI-z | TEST DATA INPUT THREE |
| 81 → | 0x9 | HI-z | HI-z | HIGH IMPEDENCE |
| 82 → | 0xA | HI-z | TDO_0 | TEST DATA OUTPUT ZERO |
| | 0xB | HI-z | TDO_1 | TEST DATA OUTPUT ONE |
| | 0xC | HI-z | TDO_2 | TEST DATA OUTPUT TWO |
| | 0xD | HI-z | TDO_3 | TEST DATA OUTPUT THREE |
| | 0xE | HI-z | '1' | ONE |
| 83 → 84 → | 0xF | '1' | HI-z | HIGH IMPEDENCE |

*FIG. 8*

| MODE | PROTOCOL |
|---|---|
| 00 | J_1 |
| 01 | J_3 |
| 10 | J_4 |
| 11 | J_5 |

*FIG. 10*

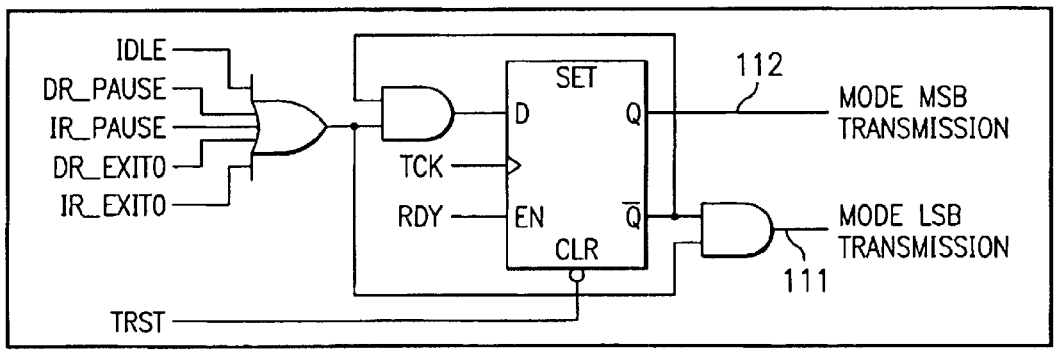

*FIG. 11*

SCAN INTERFACE WITH TDM FEATURE FOR PERMITTING SIGNAL OVERLAY

This application claims the priority under 35 U.S.C. 119(e)(1) of the following U.S. provisional applications Ser. Nos. 60/186,326 filed on Mar. 2, 2000 now U.S. patent application Ser. No. 09/798,173; and 60/219,340 originally filed on Mar. 2, 2000 as non-provisional U.S. Ser. No. 09/515,093 and thereafter converted to provisional application status by a petition granted on Aug. 18, 2000.

FIELD OF THE INVENTION

The invention relates generally to electronic data processing and, more particularly, to emulation, simulation and test capabilities of electronic data processing devices and systems.

BACKGROUND OF THE INVENTION

Advanced wafer lithography and surface-mount packaging technology are integrating increasingly complex functions at both the silicon and printed circuit board level of electronic design. Diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive realtime debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patterns would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large amount of subsequent design time is expended on test pattern creation and upgrading.

Even if a significant investment were made to design a module to be reusable and to fully create and grade its test patterns, subsequent use of the module may bury it in application specific logic, and make its access difficult or impossible. Consequently, it is desirable to avoid this pitfall.

The advances of IC design, for example, are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

Emulation technology utilizing scan based emulation and multiprocessing debug was introduced over 10 years ago. In 1988, the change from conventional in circuit emulation to scan based emulation was motivated by design cycle time pressures and newly available space for on-chip emulation. Design cycle time pressure was created by three factors: higher integration levels—such as on-chip memory; increasing clock rates—caused electrical intrusiveness by emulation support logic; and more sophisticated packaging—created emulator connectivity issues.

Today these same factors, with new twists, are challenging a scan based emulator's ability to deliver the system debug facilities needed by today's complex, higher clock rate, highly integrated designs. The resulting systems are smaller, faster, and cheaper. They are higher performance with footprints that are increasingly dense. Each of these positive system trends adversely affects the observation of system activity, the key enabler for rapid system development. The effect is called "vanishing visibility".

Application developers prefer visibility and control of all relevant system activity. The steady progression of integration levels and increases in clock rates steadily decrease the visibility and control available over time. These forces create a visibility and control gap, the difference between the desired visibility and control level and the actual level available. Over time, this gap is sure to widen. Application development tool vendors are striving to minimize the gap growth rate. Development tools software and associated hardware components must do more with less and in different ways; tackling the ease of use challenge is amplified by these forces.

With today's highly integrated System-On-a-Chip (SOC) technology, the visibility and control gap has widened dramatically. Traditional debug options such as logic analyzers and partitioned prototype systems are unable to keep pace with the integration levels and ever increasing clock rates of today's systems.

As integration levels increase, system buses connecting numerous subsystem components move on chip, denying traditional logic analyzers access to these buses. With limited or no significant bus visibility, tools like logic analyzers cannot be used to view system activity or provide the trigger mechanisms needed to control the system under development. A loss of control accompanies this loss in visibility, as it is difficult to control things that are not accessible.

To combat this trend, system designers have worked to keep these buses exposed, building system components in a way that enabled the construction of prototyping systems with exposed buses. This approach is also under siege from the ever-increasing march of system clock rates. As CPU clock rates increase, chip to chip interface speeds are not keeping pace. Developers find that a partitioned system's performance does not keep pace with its integrated counterpart, due to interface wait states added to compensate for lagging chip to chip communication rates. At some point, this performance degradation reaches intolerable levels and the partitioned prototype system is no longer a viable debug option. We have entered an era where production devices must serve as the platform for application development.

Increasing CPU clock rates are also accelerating the demise of other simple visibility mechanisms. Since the CPU clock rates can exceed maximum I/O state rates, visibility ports exporting information in native form can no longer keep up with the CPU. On-chip subsystems are also operated at clock rates that are slower than the CPU clock rate. This approach may be used to simplify system design and reduce power consumption. These developments mean simple visibility ports can no longer be counted on to deliver a clear view of CPU activity.

As visibility and control diminish, the development tools used to develop the application become less productive. The tools also appear harder to use due to the increasing tool complexity required to maintain visibility and control. The visibility, control, and ease of use issues created by systems-on-a-chip are poised to lengthen product development cycles.

Even as the integration trends present developers with a difficult debug environment, they also present hope that new approaches to debug problems will emerge. The increased densities and clock rates that create development cycle time pressures also create opportunities to solve them.

On-chip, debug facilities are more affordable than ever before. As high speed, high performance chips are increasingly dominated by very large memory structures, the system cost associated with the random logic accompanying the CPU and memory subsystems is dropping as a percentage of total system cost. The cost of a several thousand gates is at an all time low, and can in some cases be tucked into a corner of today's chip designs. Cost per pin in today's high density packages has also dropped, making it easier to allocate more pins for debug. The combination of affordable gates and pins enables the deployment of new, on-chip emulation facilities needed to address the challenges created by systems-on-a-chip.

When production devices also serve as the application debug platform, they must provide sufficient debug capabilities to support time to market objectives. Since the debugging requirements vary with different applications, it is highly desirable to be able to adjust the on-chip debug facilities to balance time to market and cost needs.

Since these on-chip capabilities affect the chip's recurring cost, the scalability of any solution is of primary importance. "Pay only for what you need" should be the guiding principle for on-chip tools deployment. In this new paradigm, the system architect may also specify the on-chip debug facilities along with the remainder of functionality, balancing chip cost constraints and the debug needs of the product development team.

The emulation technology of the present invention uses the debug upside opportunities noted above to provide developers with an arsenal of debug capability aimed at narrowing the control and visibility gap.

This emulation technology delivers solutions to the complex debug problems of today's highly integrated embedded real-time systems. This technology attacks the loss of visibility, control, and ease of use issues described in the preceding section while expanding the feature set of current emulators.

The on-chip debug component of the present invention provides a means for optimizing the cost and debug capabilities. The architecture allows for flexible combinations of emulation components or peripherals tailored to meet system cost and time to market constraints. The scalability aspect makes it feasible to include them in production devices with manageable cost and limited performance overhead.

BRIEF DESCRIPTION OF THE DRAWINGS

FIG. 3 provides in tabular format a definition of a plurality of scan interfaces between the emulator and target device of FIGS. 1 and 2 according to the invention.

FIG. 4 diagrammatically illustrates an exemplary embodiment of a scan interface between the emulator and target device of FIGS. 1 and 2 according to the invention.

FIG. 5 diagrammatically illustrates a further exemplary embodiment of a scan interface between the emulator and target device of FIGS. 1 and 2 according to the invention.

FIG. 6 illustrates in tabular format exemplary operations which can be performed by the scan interface of FIG. 4.

FIG. 8 illustrates in tabular format exemplary operations which can be performed by the scan interface of FIG. 5.

FIG. 10 illustrates in tabular format exemplary mode bits which can be scanned into the target device of FIGS. 2, 4 and 5 to select corresponding scan interface modes illustrated in FIG. 2.

FIG. 11 diagrammatically illustrates an exemplary embodiment of a transmission controller for the mode bits of FIG. 10.

DETAILED DESCRIPTION

Figure 1:
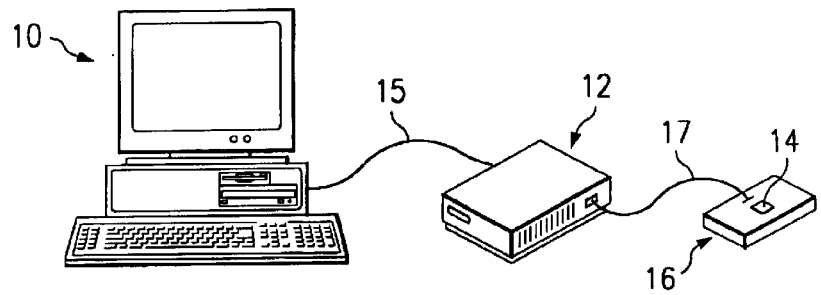
FIG. 1 diagrammatically illustrates exemplary embodiments of an emulation system according to the invention.

Emulation, debug, and simulation tools of the present invention are described herein. The emulation and debug solutions described herein are based on the premise that, over time, some if not most debug functions traditionally performed off chip must be integrated into the production device if they are to remain in the developer's debug arsenal. To support the migration of debug junctions on chip, the present invention provides a powerful and scalable portfolio of debug capabilities for on-chip deployment. This technology preserves all the gains of initial JTAG technology while adding capabilities that directly assault the visibility, control, and ease of use issues created by the vanishing visibility trend.

Four significant architectural infrastructure components spearhead the assault on the control and visibility gap described earlier herein:
1. Real-time Emulation (RTE);
2. Real-time Data Exchange RTDX™ a trademark of Texas Instruments Incorporated);
3. Trace; and
4. Advanced Analysis.

These components address visibility and control needs as shown in Table 1.

both bi-directional and uni-directional DSP target/host data transfers facilitated by the emulator. The DSP (or target) application may collect target data to be transferred to the host or receive data from the host, while emulation hardware (within the DSP and the emulator) manages the actual transfer. Several RTDX™ transfer mechanisms are supported, each providing different levels of bandwidth and pin utilization allowing the trade off of gates and pin availability against bandwidth requirements.

Trace is a non-intrusive mechanism of providing visibility of the application activity. Trace is used to monitor CPU related activity such as program flow and memory accesses, system activity such as ASIC state machines, data streams and CPU collected data. Historical trace technology also used logic analyzer like collection and special emulation (SEs) devices with more pins than a production device. The logic analyzer or like device processed native representations of the data using a state machine like programming interface (filter mechanism). This trace model relied on all activity being exported with external triggering selecting the data that needed to be stored, viewed and analyzed.

TABLE 1

Emulation System Architecture and Usage

| Architectural Component | Visibility Provisions | Control Provisions | Debug Usage |
| --- | --- | --- | --- |
| RTE | Statoc view of the CPU and memory state after background program is stopped. Interrupt driven code continues to execute. | Analysis components are used to stop execution of background program. | Basic debug Computational problems Code design problems |
| RTDX ™ | Debugger software interacts with the application code to exchange commands and data while the application continues to execute. | Analysis components are used to identify observation points and interrupt program flow to collect data. | Dynamic instrumentation Dynamic variable adjustments Dynamic data collection |
| Trace | Bus snooper hardware collects selective program flow and data transactions for export without interacting with the application. | Analysis components are used to define program segments and bus transactions that are to be recorded for export. | Prog. Flow corruption debug Memory corruption Benchmarking Code Coverage Path Coverage Program timing problems |
| Analysis | Allows observation of occurrences of events or event sequences. Measure elapsed time between events. Generate external triggers. | Alter program flow after the detection of events or event sequences. | Benchmarking Event/sequence identification Ext. trigger generation Stop program execution Activate Trace and RTDX ™ |

Real-Time Emulation (RTE) provides a base set of fixed capabilities for real-time execution control (run, step, halt, etc.) and register/memory visibility. This component allows the user to debug application code while real-time interrupts continue to be serviced. Registers and memory may be accessed in real-time with no impact to interrupt processing. Users may distinguish between real-time and non real-time interrupts, and mark code that must not be disturbed by real-time debug memory accesses. This base emulation capability includes hardware that can be configured as two single point hardware breakpoints, a single data watchpoint, an event counter, or a data logging mechanism. The EMU pin capability includes trigger I/Os for multiprocessor event processing and a uni-directional (target to host) data logging mechanism.

RTDX™ provides real-time data transfers between an emulator host and target application. This component offers Existing logic analyzer like technology does not, however, provide a solution to decreasing visibility due to higher integration levels, increasing clock rates and more sophisticated packaging. In this model, the production device must provide visibility through a limited number of pins. The data exported is encoded or compressed to reduce the export bandwidth required. The recording mechanism becomes a pure recording device, packing exported data into a deep trace memory. Trace software is used to convert the recorded data into a record of system activity.

On-chip Trace with high speed serial data export, in combination with Advanced Analysis provides a solution for SOC designs. Trace is used to monitor CPU related activity such as program flow and memory accesses, system activity such as ASIC state machines, data streams etc. and CPU collected data. This creates four different classes of trace data:

Program flow and timing provided by the DSP core (PC trace);

Memory data references made by the DSP core or chip level peripherals (Data reads and writes);

Application specific signals and data (ASIC activity); and CPU collected data.

Collection mechanisms for the four classes of trace data are modular allowing the trade off of functionality verses gates and pins required to meet desired bandwidth requirements.

The RTDX™ and Trace functions provide similar, but different forms of visibility. They differ in terms of how data is collected, and the circumstances under which they would be most effective. A brief explanation is included below for clarity.

RTDX™ (Real Time Data eXchange) is a CPU assisted solution for exchanging information; the data to be exchanged have a well-defined behavior in relation to the program flow. For example, RTDX™ can be used to record the input or output buffers from a DSP algorithm. RTDX™ requires CPU assistance in collecting data hence there is definite, but small, CPU bandwidth required to accomplish this. Thus, RTDX™ is an application intrusive mechanism of providing visibility with low recurring overhead cost.

Trace is a non-intrusive, hardware-assisted collection mechanism (such as, bus snoopers) with very high bandwidth (BW) data export. Trace is used when there is a need to export data at a very high data rate or when the behavior of the information to be traced is not known, or is random in nature or associated with an address. Program flow is a typical example where it is not possible to know the behavior a priori. The bandwidth required to export this class of information is high. Data trace of specified addresses is another example. The bandwidth required to export data trace is very high.

Trace data is unidirectional, going from target to host only. RTDX™ can exchange data in either direction although unidirectional forms of RTDX™ are supported (data logging). The Trace data path can also be used to provide very high speed uni-directional RTDX™ (CPU collected trace data).

The high level features of Trace and RTDX™ are outlined in Table 2.

TABLE 2

RTDX ™ and Trace Features

| Features | RTDX ™ | Trace |
| --- | --- | --- |
| Bandwidth/pin | Low | High |
| Intrusiveness | Intrusive | Non-intrusive |
| Data Exchange | Bi-directional or uni-directional | Export only |
| Data collection | CPU assisted | CPU or Hardware assisted |
| Data transfer | No extra hardware for minimum BW (optional hardware for higher BW) | Hardware assisted |
| Cost | Relatively low recurring cost | Relatively high recurring cost |

Advanced analysis provides a non-intrusive on-chip event detection and trigger generation mechanism. The trigger outputs created by advanced analysis control other infrastructure components such as Trace and RTDX™. Historical trace technology used bus activity exported to a logic analyzer to generate triggers that controlled trace within the logic analyzer unit or generated triggers which were supplied to the device to halt execution. This usually involved a chip that had more pins than the production device (an SE or special emulation device). This analysis model does not work well in the System-on-a-Chip (SOC) era as the integration levels and clock rates of today's devices preclude full visibility bus export.

Advanced analysis provides affordable on-chip instruction and data bus comparators, sequencers and state machines, and event counters to recreate the most important portions of the triggering function historically found off chip. Advanced analysis provides the control aspect of debug triggering mechanism for Trace, RTDX™ and Real-Time Emulation. This architectural component identifies events, tracks event sequences, and assigns actions based on their occurrence (break execution, enable/disable trace, count, enable/disable RTDX™, etc.). The modular building blocks for this capability include bus comparators, external event generators, state machines or state sequencers, and trigger generators. The modularity of the advanced analysis system allows the trade off of functionality versus gates.

Emulator capability is created by the interaction of four emulator components:
1. debugger application program;
2. host computer;
3. emulation controller; and
4. on-chip debug facilities.

These components are connected as shown in FIG. 1. The host computer 10 is connected to an emulation controller 12 (external to the host) with the emulation controller (also referred to herein as the emulator or the controller) also connected to the target system 16. The user preferably controls the target application through a debugger application program, running on the host computer, for example, Texas Instruments' Code Composer Studio program.

A typical debug system is shown in FIG. 1. This system uses a host computer 10 (generally a PC) to access the debug capabilities through an emulator 12. The debugger application program presents the debug capabilities in a user-friendly form via the host computer. The debug resources are allocated by debug software on an as needed basis, relieving the user of this burden. Source level debug utilizes the debug resources, hiding their complexity from the user. The debugger together with the on-chip Trace and triggering facilities provide a means to select, record, and display chip activity of interest. Trace displays are automatically correlated to the source code that generated the trace log. The emulator provides both the debug control and trace recording function.

The debug facilities are programmed using standard emulator debug accesses through the target chips' JTAG or similar serial debug interface. Since pins are at a premium, the technology provides for the sharing of the debug pin pool by trace, trigger, and other debug functions with a small increment in silicon cost. Fixed pin formats are also supported. When the sharing of pins option is deployed, the debug pin utilization is determined at the beginning of each debug session (before the chip is directed to run the application program), maximizing the trace export bandwidth. Trace bandwidth is maximized by allocating the maximum number of pins to trace.

The debug capability and building blocks within a system may vary. The emulator software therefore establishes the configuration at run-time. This approach requires the hardware blocks to meet a set of constraints dealing with configuration and register organization. Other components provide a hardware search capability designed to locate the blocks and other peripherals in the system memory map. The emulator software uses a search facility to locate the resources. The address where the modules are located and a type ID uniquely identifies each block found. Once the IDs are found, a design database may be used to ascertain the exact configuration and all system inputs and outputs.

The host computer is generally a PC with at least 64 Mbytes of memory and capable of running at least Windows95, SR-2, Windows NT, or later versions of Windows. The PC must support one of the communications interfaces required by the emulator, for example:
Ethernet 10T and 100T, TCP/IP protocol;
Universal Serial Bus (USB), rev 1.x;
Firewire, IEEE 1394; and/or
Parallel Port (SPP, EPP, and ECP).

The emulation controller 12 provides a bridge between the host computer 10 and target system 16, handling all debug information passed between the debugger application running on the host computer and a target application executing on a DSP (or other target processor) 14.

One exemplary emulator configuration supports all of the following capabilities:
Real-time Emulation;
RTDX™;
Trace; and
Advanced Analysis.

Additionally, the emulator-to-target interface supports:
Input and output triggers;
Bit I/O; and
Managing special extended operating modes.

The emulation controller 12 accesses Real-time Emulation capabilities (execution control, memory, and register access) via a 3, 4, or 5 bit scan based interface. RTDX™ capabilities can be accessed by scan or by using three higher bandwidth RTDX™ formats that use direct target-to-emulator connections other than scan. The input and output triggers allow other system components to signal the chip with debug events and vice-versa.

The emulator 12 is partitioned into communication and emulation sections. The communication section supports communication with the host 10 on host communication links while the emulation section interfaces to the target, managing target debug functions and the device debug port. The emulator 12 communicates with the host computer 10 using e.g., one of the aforementioned industry standards communication links at 15. The host-to-emulator connection can be established with off the shelf cabling technology. Host-to-emulator separation is governed by the standards applied to the interface used.

The emulation controller 12 communicates with the target system 16 through a target cable or cables at 17. Debug, Trace, Triggers, and RTDX™ capabilities share the target cable, and in some cases, the same device pins. More than one target cable may be required when the target system deploys a trace width that cannot be accommodated in a single cable. All trace, RTDX™, and debug communication occurs over this link.

Figure 2:
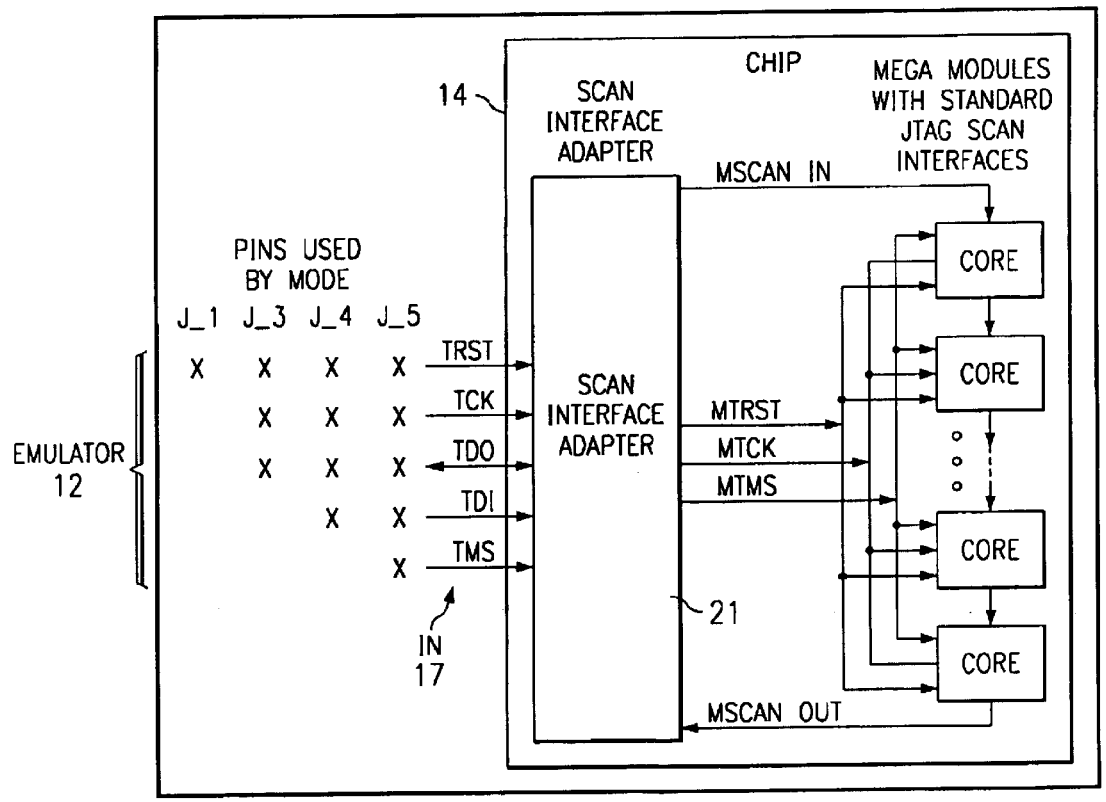
FIG. 2 diagrammatically illustrates pertinent portions of exemplary embodiments of the system of FIG. 1 according to the invention.

FIG. 2 diagrammatically illustrates pertinent portions of exemplary embodiments of the emulation system of FIG. 1. FIG. 2 includes a scan interface provided in the cable 17 between the emulator 12 and the target chip 14. As illustrated in FIG. 2, the emulator 12 can select any one of a plurality of modes of operation for the scan interface. In the examples disclosed herein, the scan interface is a standard JTAG scan interface, but the invention is also applicable to other types of scan interfaces. Herein, mode J_5 represents the standard JTAG format which utilizes five pins of the target chip. Modes J_4 and J_3 designate modes of scan operation wherein time division multiplexing is utilized to combine two or more of the five JTAG signals on a single pin of the scan interface, thereby freeing one or more of the five pins normally associated with standard J_5 operation. Mode J_4 multiplexes two JTAG signals onto a single pin, and thus requires four pins for scan operation, thus freeing one pin for other purposes such as other debug functions. Mode J_3 multiplexes three JTAG signals onto a single pin, and thus requires only three pins for scan operation, thereby freeing two pins for other purposes such as other debug operations. In mode J_1, no multiplexing is used, but only the TRST (test logic reset) signal remains dedicated to the scan interface, thereby freeing four pins for other purposes such as debug operation.

FIG. 3 provides a description of each of the above-described modes of scan operation. Note that the J_1, J_4 and J_3 modes are limited to point-to-point connections between the emulator and a single target device, while J_35 is of course applicable to any number of scan-chained target devices.

Referring again to FIG. 2, the target chip includes a scan interface adapter 21 which is responsible for converting the signals received from the emulator, according to any of modes J_5, J_4 or J_3, into a five signal interface identical to the J_5 format, in this example, the five pin JTAG interface. In other words, signal MSCAN IN corresponds to TDI of the J_5 interface. Signal MTRST corresponds to signal TRST of the J_5 interface. Signal MTCK corresponds to signal TCK of the J_5 interface. Signal MTMS corresponds to signal TMS of the J_5 interface, and signal MSCAN OUT corresponds to signal TDO of the J_5 interface. Thus, regardless of the interface mode utilized by the emulator 12, J_5, J_4 or J_3, the scan interface adapter 21 translates this interface into, in this example, a five signal JTAG interface for test control of a plurality of cores embedded within the target chip. Conversely, the scan interface adapter 21 converts the five signal interface used within the chip into the signaling format required by the scan interface mode that has been selected on the emulator side.

FIG. 4 diagrammatically illustrates the scan interface signaling connections between the emulator and the target chip during J_4 operation. In the J_4 configuration, the emulator TDO-to-chip TDI connection is used to multiplex both the TMS signal from the emulator and the TDO signal from the emulator. These time division multiplexed (TDM) signals are received at the TDI pin of the target device. The scan interface adapter within the target device then converts from the four pin interface to the standard five signal JTAG format as described above with respect to FIG. 2. As indicated in FIG. 4, the TMS signaling path between the target device and the emulator is free for other purposes such as debug functions.

FIG. 5 illustrates the scan interface connections between the emulator and a target chip when the J_3 scan format is used. In the J_3 configuration, the emulator TDI-to-chip TDO connection is used as a bi-directional signal on which the TMS signal from the emulator, the TDO signal from the emulator and the TDI signal from the target chip are time division multiplexed. As shown in FIG. 5, this configuration frees two connections between the emulator and the target chip (TMS and target TDI-to-emulator TDO) for other purposes such as debug functions.

The aforementioned J_1 configuration permits four of the five scan interface connections to be used for other purposes such as debug functions, and the scan interface retains control of only the TRST connection so that the emulator can still selectively configure the scan interface 21 adapter for scan operations (which are of course not possible in the J_1 configuration). In particular, the assertion of TRST by the emulator causes the scan interface adapter 21 to set the scan interface to a default scan interface setting, for example J_3, J_4 or J_5. The default setting can be specified by the chip architect, and the emulator software can easily be made compatible with any choice of default operation.

FIG. 6 illustrates exemplary operations which can be performed by the scan interface adapter and emulator in the J_4 mode. As illustrated in FIG. 6, a state machine within the emulator controls the input and output sequence for the J_4 interface configuration. The state machine includes nine states to control J_4 input and output. The state sequence begins with a start bit, followed by four TMS values, followed by four TDI values. The scan interface adapter in the target device also includes a state machine which is operable to convert the J_4 interface to the J_5 interface, including enabling the signal MTCK of FIG. 2 during only four states (0x 4, 0x5, 0x6 and 0x7) of the nine state sequence, which four states are used for TDO output from the target to the emulator and parallel TMS/TDI output from the scan interface adaptor to the cores.

In one embodiment, when a 0 is applied to the TRST pin of the target chip of FIG. 4, the state machine within the chip's scan interface adapter is forced to a start state (0xF). The state machine can also be forced into the start state, in some embodiments, if the emulator's TDO signal is a logic 1 for a least 9 consecutive cycles of TCK when TCK is running continuously. While the scan interface adapter is in the start state, if it detects a logic 1 on its TDI input, it asserts test reset (MTRST in FIG. 2) to the cores of the target chip, and remains in the start state. When the scan interface adapter detects a 0 on its TDI input while in the start state, the state machine begins the state progression illustrated in FIG. 6, progressing sequentially from state 0x0 to state 0x7, and then to the start state 0xF, where it again performs the check for a logic 0 on its TDI input.

Figure 7:
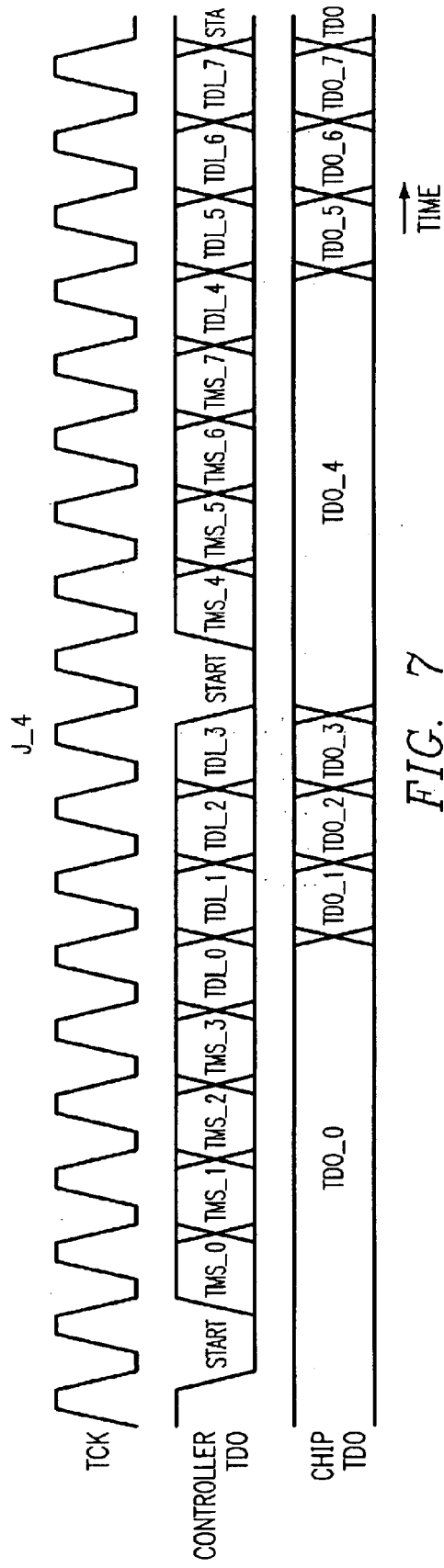
FIG. 7 is a timing diagram which corresponds to the operations illustrated in FIG. 6.

FIG. 7 is a timing diagram which corresponds to the J_4 operations illustrated in FIG. 6.

FIG. 8 illustrates exemplary operations which can be performed by the emulator and scan interface adapter in the J_3 scan mode. In this mode, the scan interface adapter initializes its state machine to the reset state when the emulator supplies at least sixteen clocks (TCK) while a logic 1 is supplied by the emulator to the TDO pin of the target device. The state machine within the emulator cooperates with the adapter state machine, using sixteen states to manage the J_3 scan operation. The state sequence begins with the emulator sending from its TDI pin to the TDO pin of the target device a start bit (0) followed by four TMS values, followed by four TDI values. On the next TCK pulse, the emulator ceases to drive the TDO pin of the target device. At this point, designated at 81 in FIG. 8, neither the emulator nor the target device is driving the TDO pin of the target device.

Upon the next TCK pulse at 82, the target device drives its TDO pin for the first of five TCK cycles. During the first four of these TCK cycles, the target device drives out target device scan data TDO_0–TDO_3. The signal MTCK of FIG. 2 is enabled only during these four states, to permit parallel TMS/TDI output from the scan interface adaptor to the cores. During the fifth TCK cycle, the target device drives its TDO pin value to logic 1 as illustrated at 83.

Upon the next TCK pulse at 84, the target device relinquishes control of its TDO pin to the emulator, and the emulator drives logic 1. Because both the emulator and the target device are driving a logic 1 when control is exchanged at 84, there is no bus conflict during this exchange of control. During the next TCK cycle, the emulator applies the start bit to begin the FIG. 8 sequence again.

If the default mode for the scan interface adapter is J_3, then the state machine of the target device is forced to state 0xF when the TRST pin is driven to 0. When the state machine of the target device is in state 0xF, whether by operation of TRST or by sequencing through the states illustrated in FIG. 8, the target device state machine expects the emulator to supply the logic 0 start bit. Failure to detect the start bit means the emulator and target have lost synchronization, the emulator is not present, or the emulator and target are operating in different scan interface modes. If the target device state machine detects a logic 1 during the 0xF state, then the state machine of the target device asserts MTRST to the internal cores of the target device, and remains in the state 0xF. When a 0 is detected on the target device TDO input with the target device state machine in state 0xF, the target device state machine begins its state progression, progressing sequentially from state 0x0 through 0xE, and then to state 0xF where it again performs the aforementioned check for a logic 0 start bit on its TDO pin. When the emulator applies a continuously running TCK and the TDO pin of the target device is pulled up to a logic 1, the state machine within the scan interface adapter of the target device initializes to the test reset condition within sixteen TCK cycles when TRST is not asserted during the period that TDO is pulled up to logic 1 with a continuously running TCK.

Figure 9:
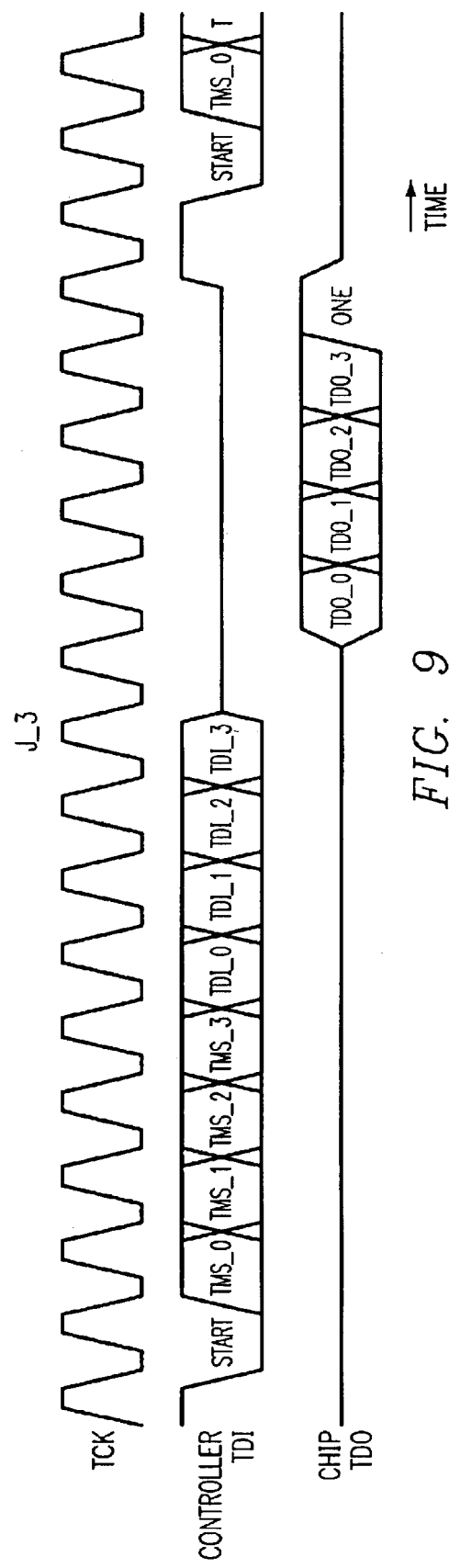
FIG. 9 is a timing diagram which corresponds to the operations of FIG. 8.

FIG. 9 is a timing diagram which corresponds to the J_3 operations of FIG. 8.

The selected scan interface mode, i.e. J_5, J_4, J_3 or J_1 can be transmitted from the emulator to the target device as TDI information, for example as a pair of bits with LSB followed by MSB, in the TDI data stream. In some embodiments, once the LSB of the mode information has been transmitted, the MSB of the mode information is always transmitted in the next TDI information slot. Taking a JTAG embodiment as an example, the transmission of mode bit pairs can be initiated, for example, by the following conditions:

IDLE state following a TRST, IR_UPDATE or DR_UPDATE state;
IDLE state following an IDLE state during which the LSB of the mode has been transmitted;
IR_EXIT state following a IR_SCAN state;
DR_EXIT state following a DR_SCAN state;
DR_PAUSE state following a DR_CAPTURE state;
IR_PAUSE state following a IR_CAPTURE state;
DR_PAUSE state following an DR_PAUSE state during which the LSB of the mode has been transmitted; or
IR_PAUSE state following an IR_PAUSE state during which the LSB of the mode has been transmitted.

FIG. 10 illustrates an exemplary mapping of mode bits to the desired scan interface protocol.

FIG. 11 diagrammatically illustrates an exemplary embodiment of a transmission controller for the mode bits of FIG. 10. The mode LSB is transmitted when the signal 111 is active, and the mode MSB is transmitted when the signal 112 is active.

Figure 14:
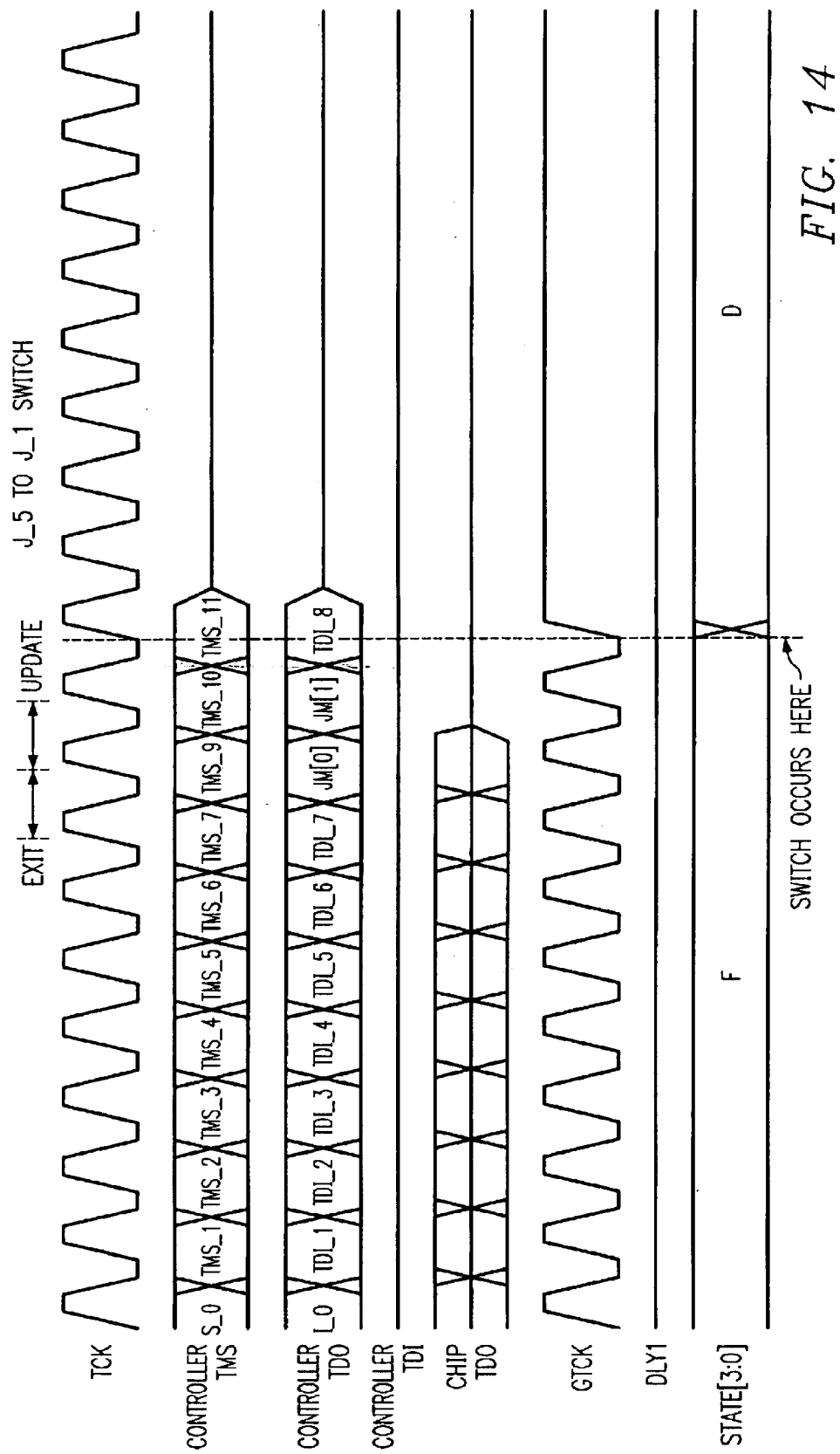
FIGS. 14–25 are timing diagrams which illustrate exemplary operations associated with switching from each of the scan interface modes illustrated in FIG. 2 to each of the other scan interface modes illustrated in FIG. 2.
Figure 15:
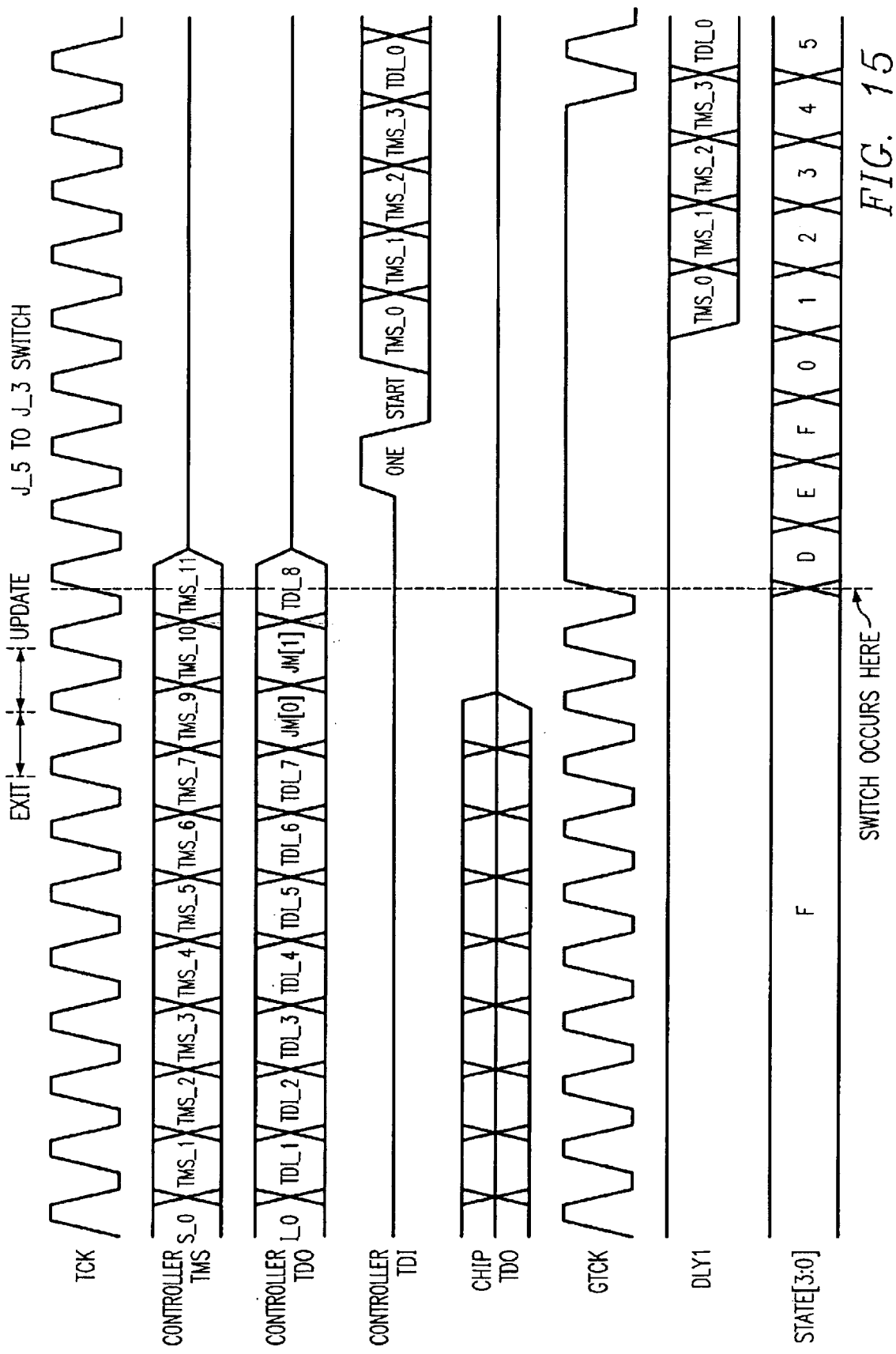
Figure 16:
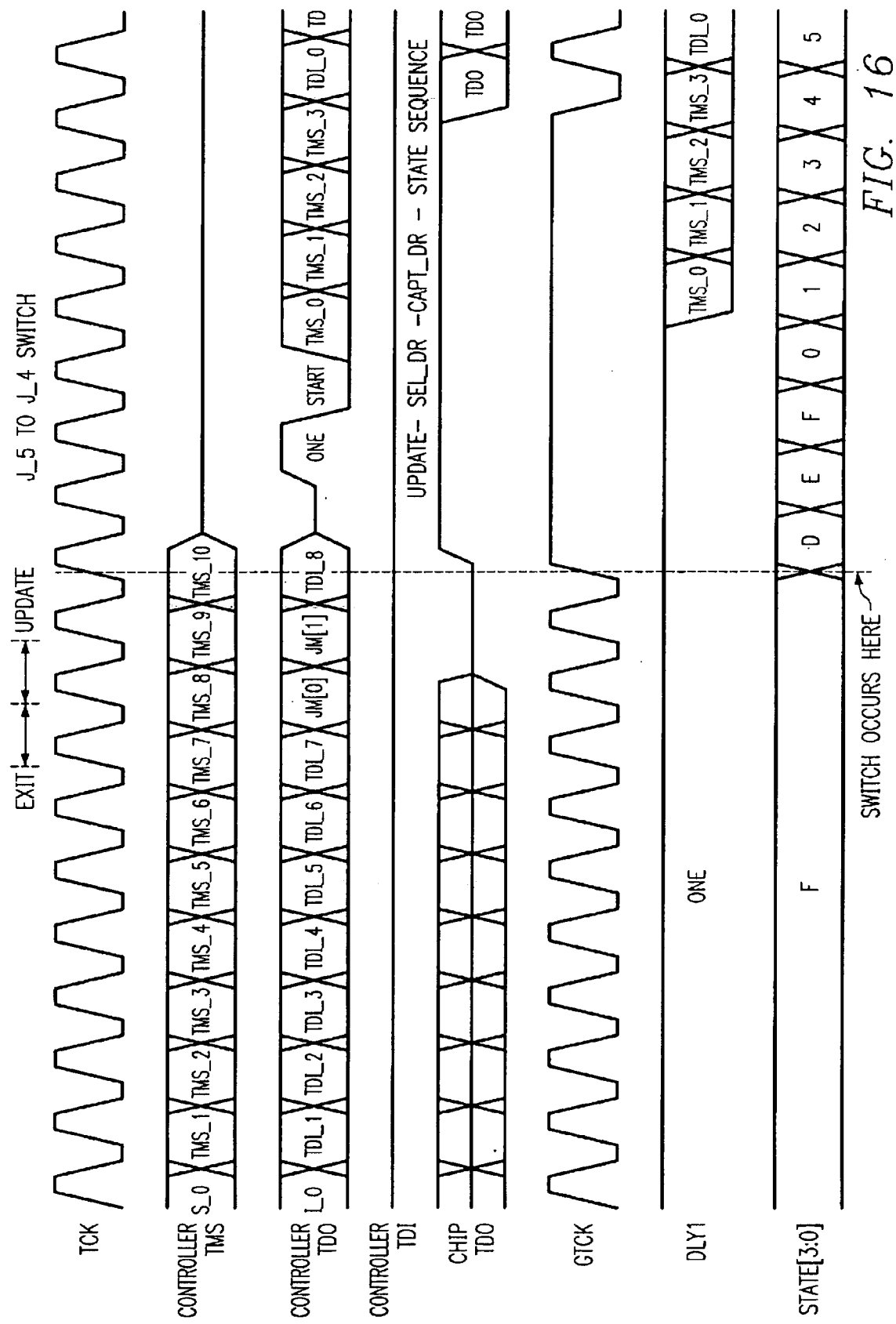
Figure 17:
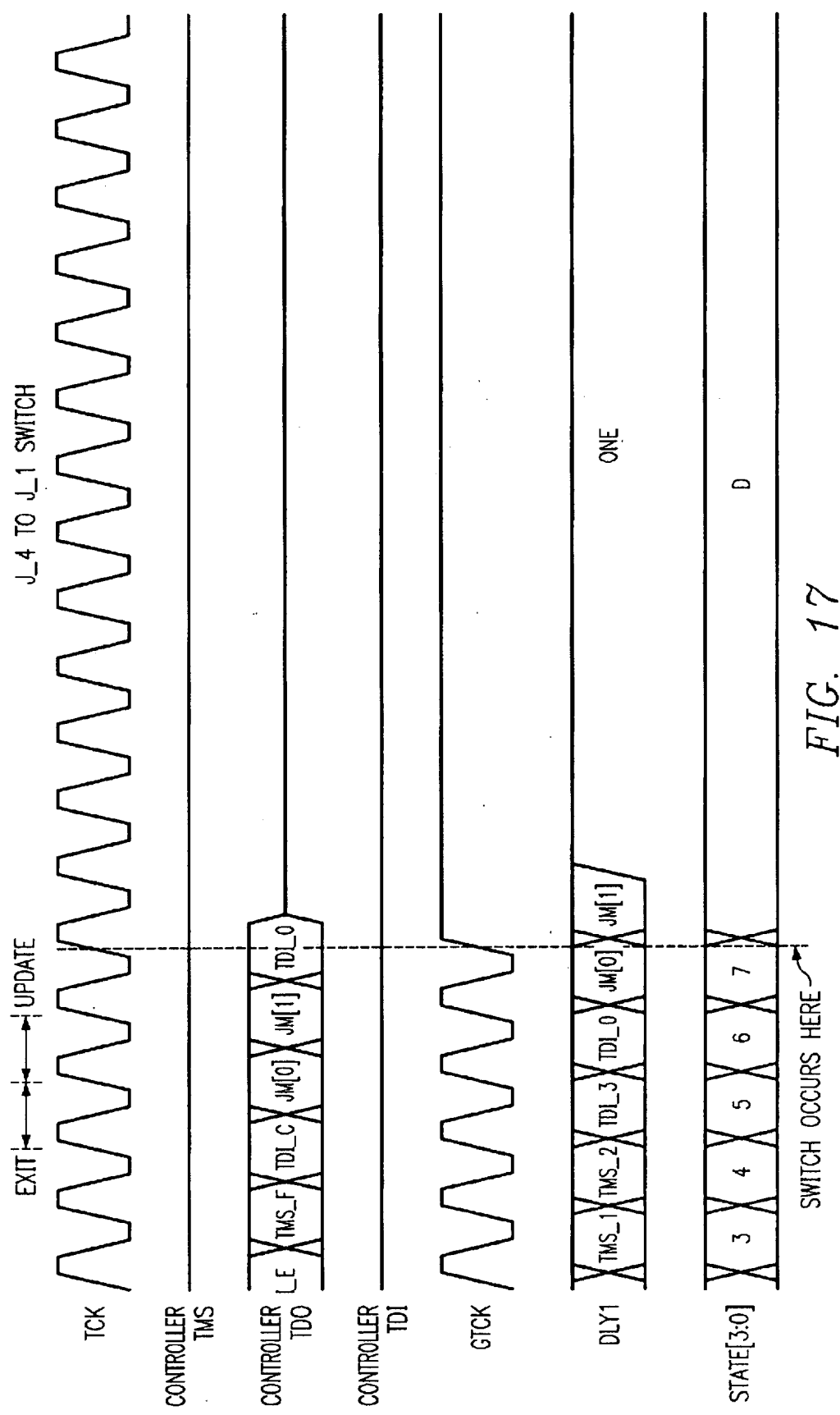
Figure 18:
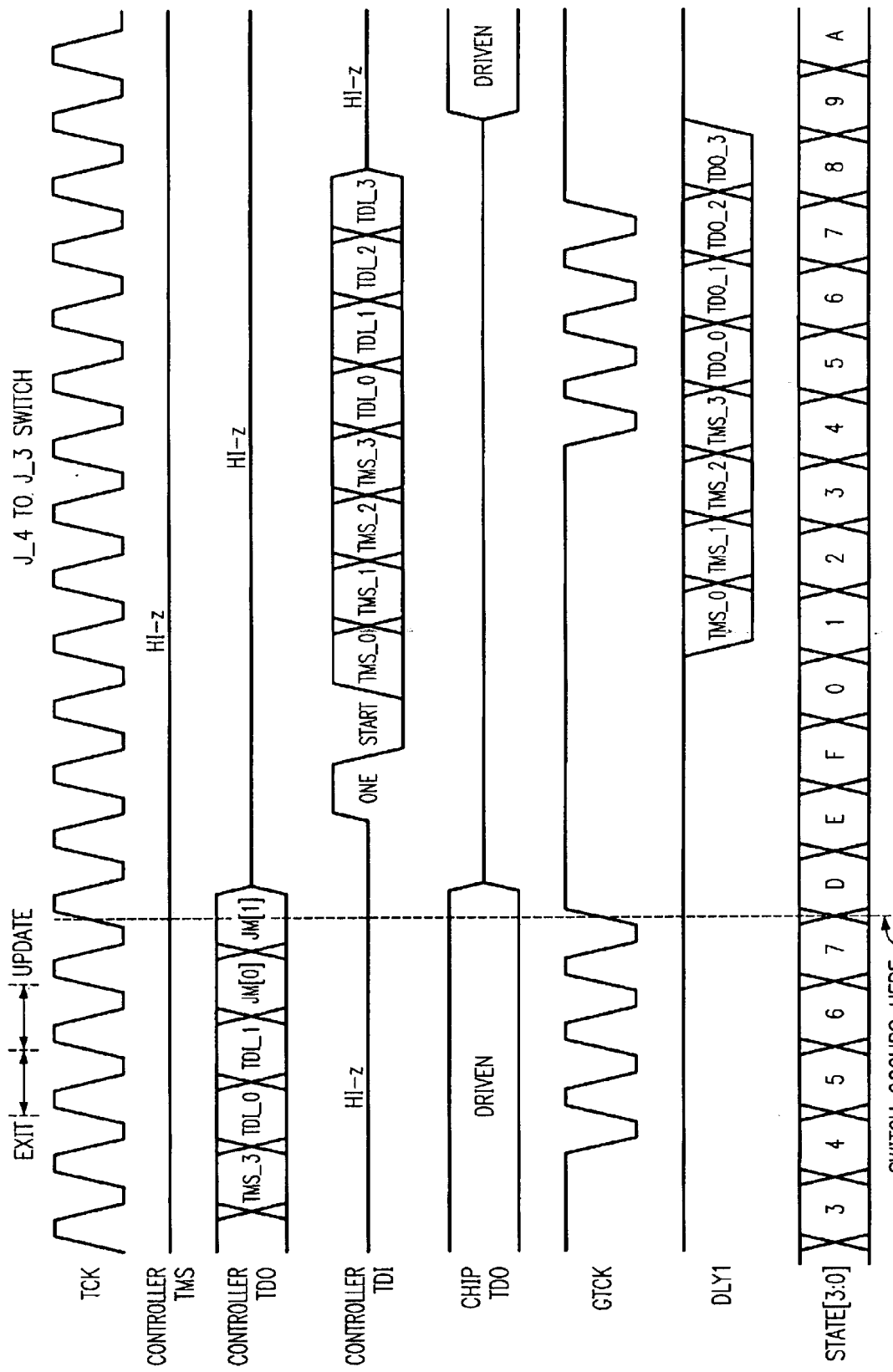
Figure 19:
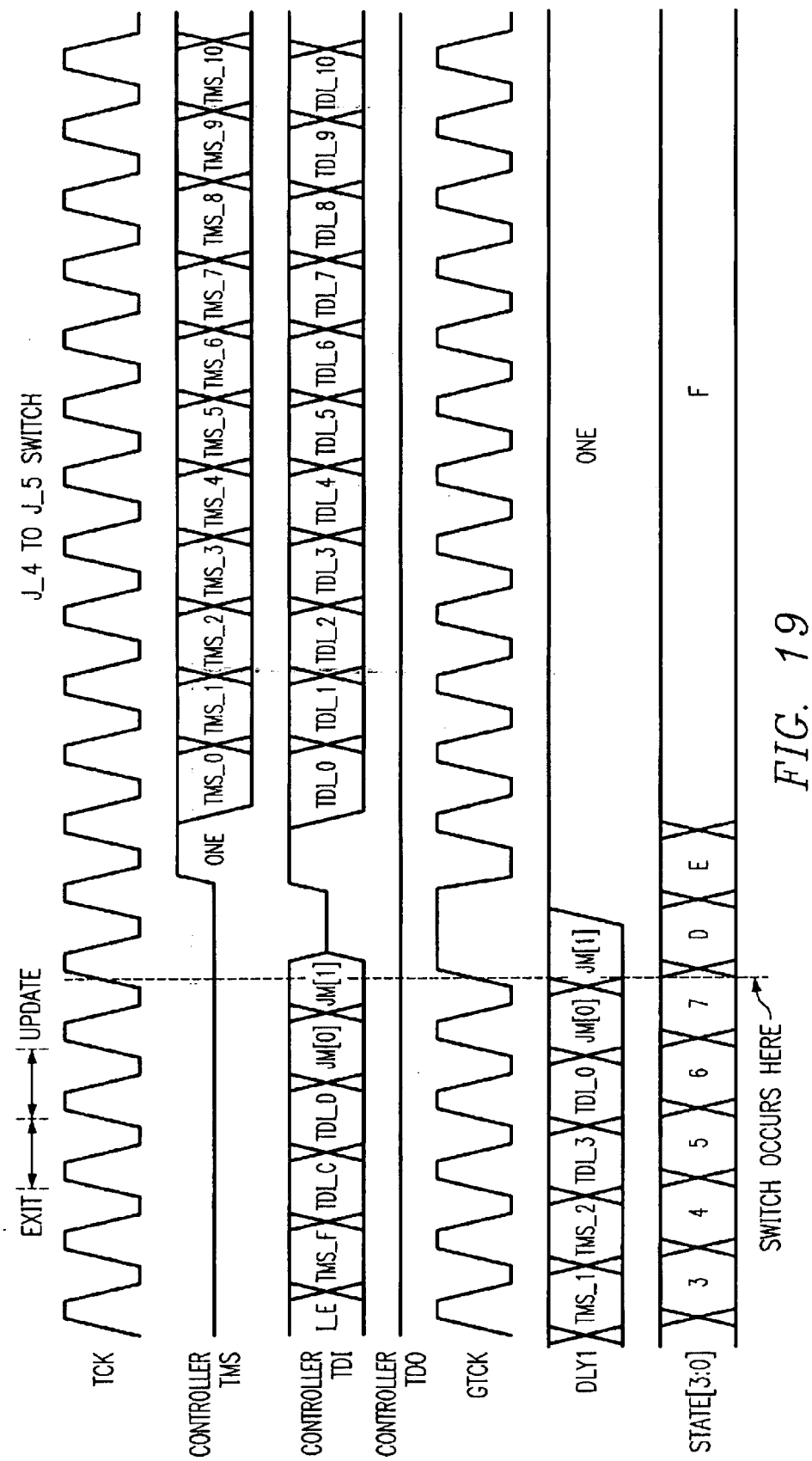
Figure 20:
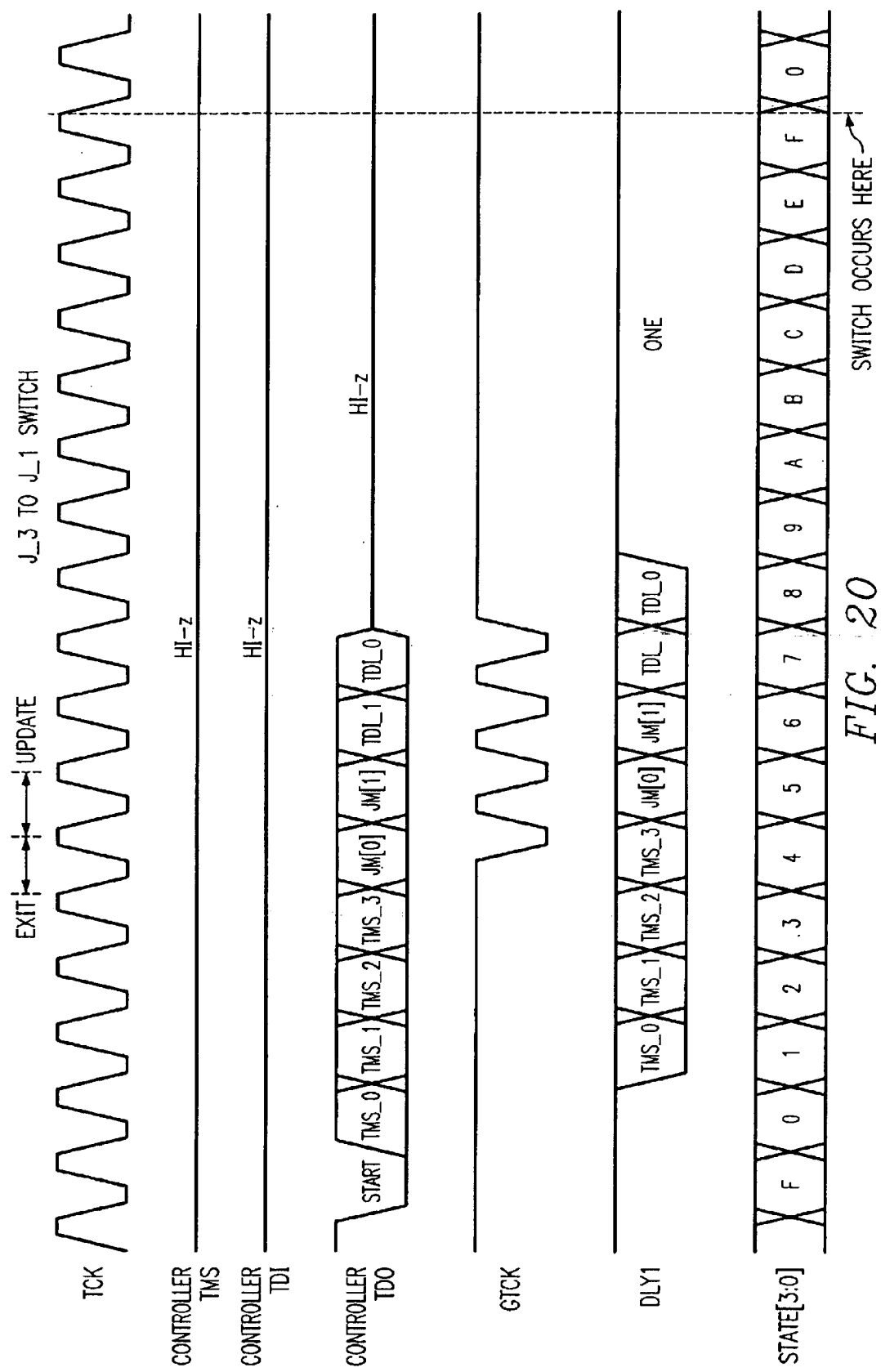
Figure 21:
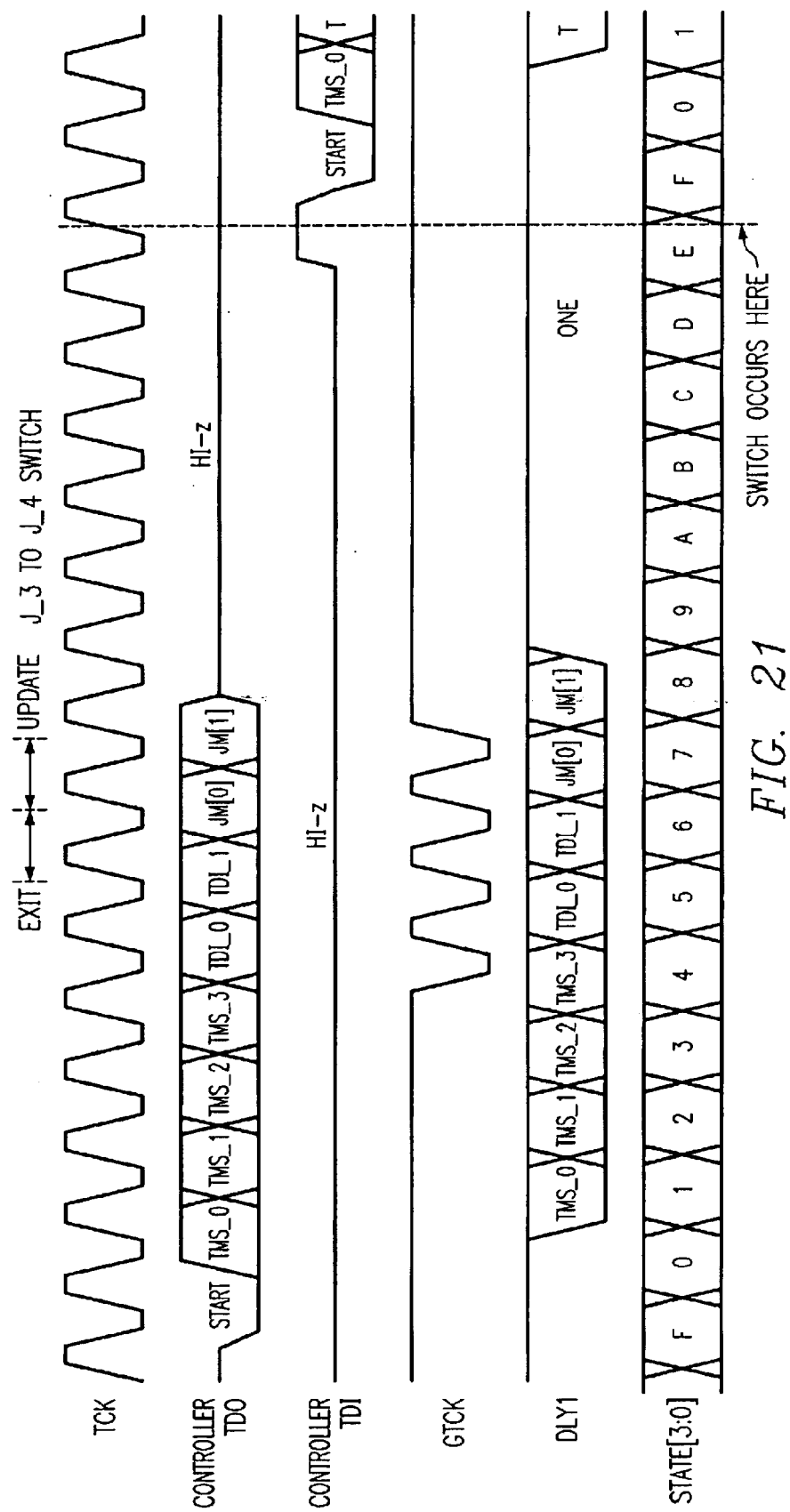
Figure 22:
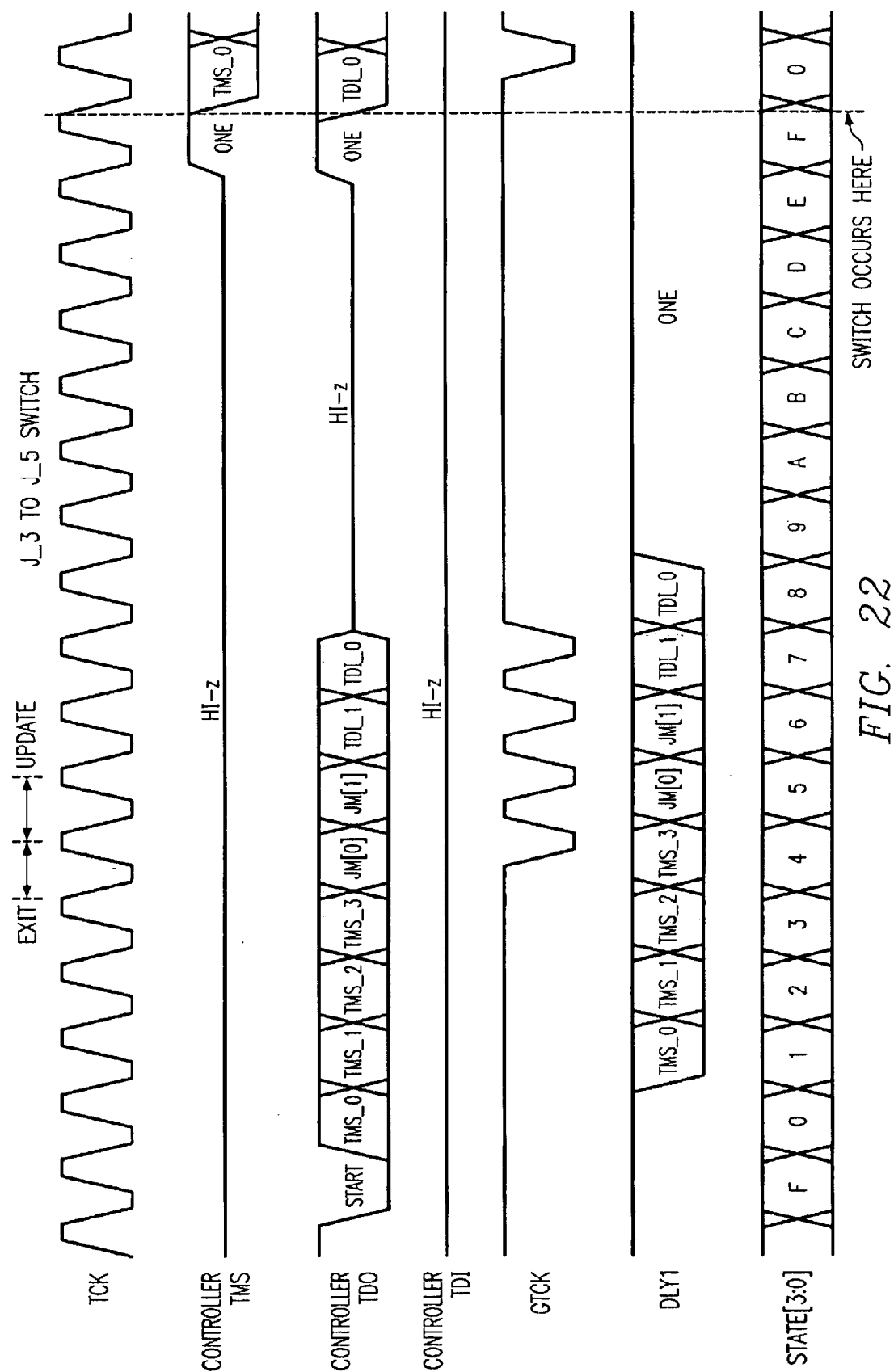
Figure 23:
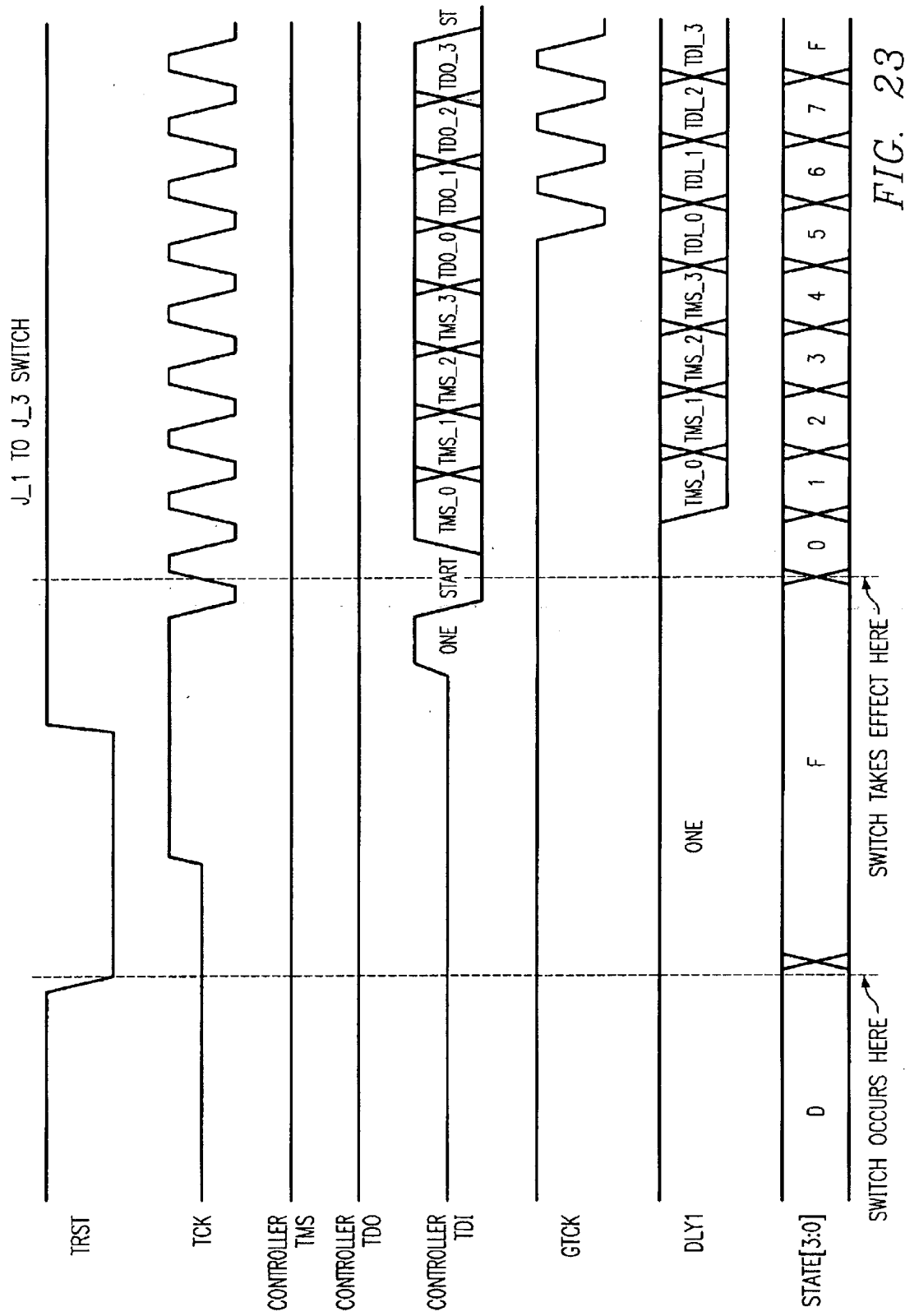
Figure 24:
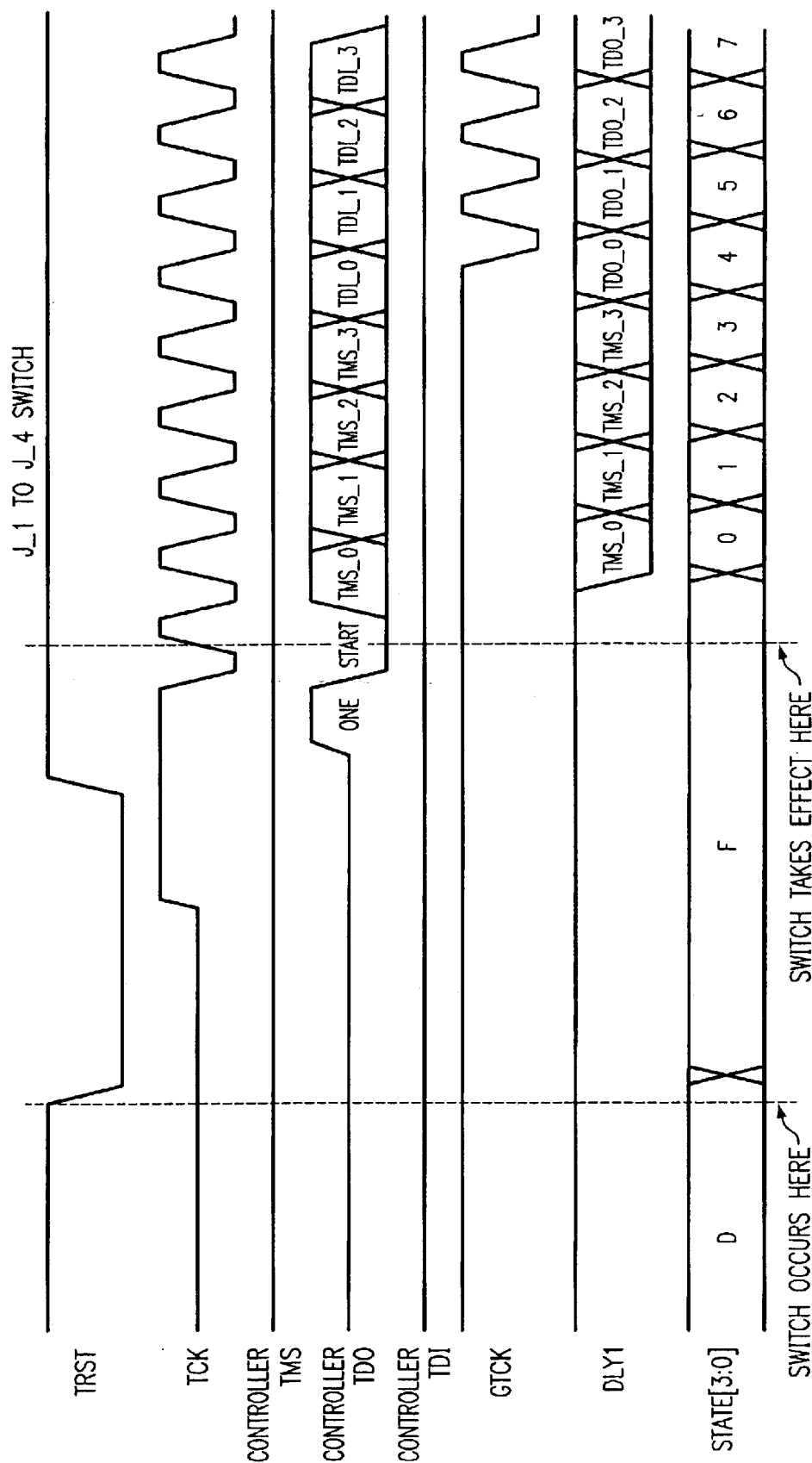
Figure 25:
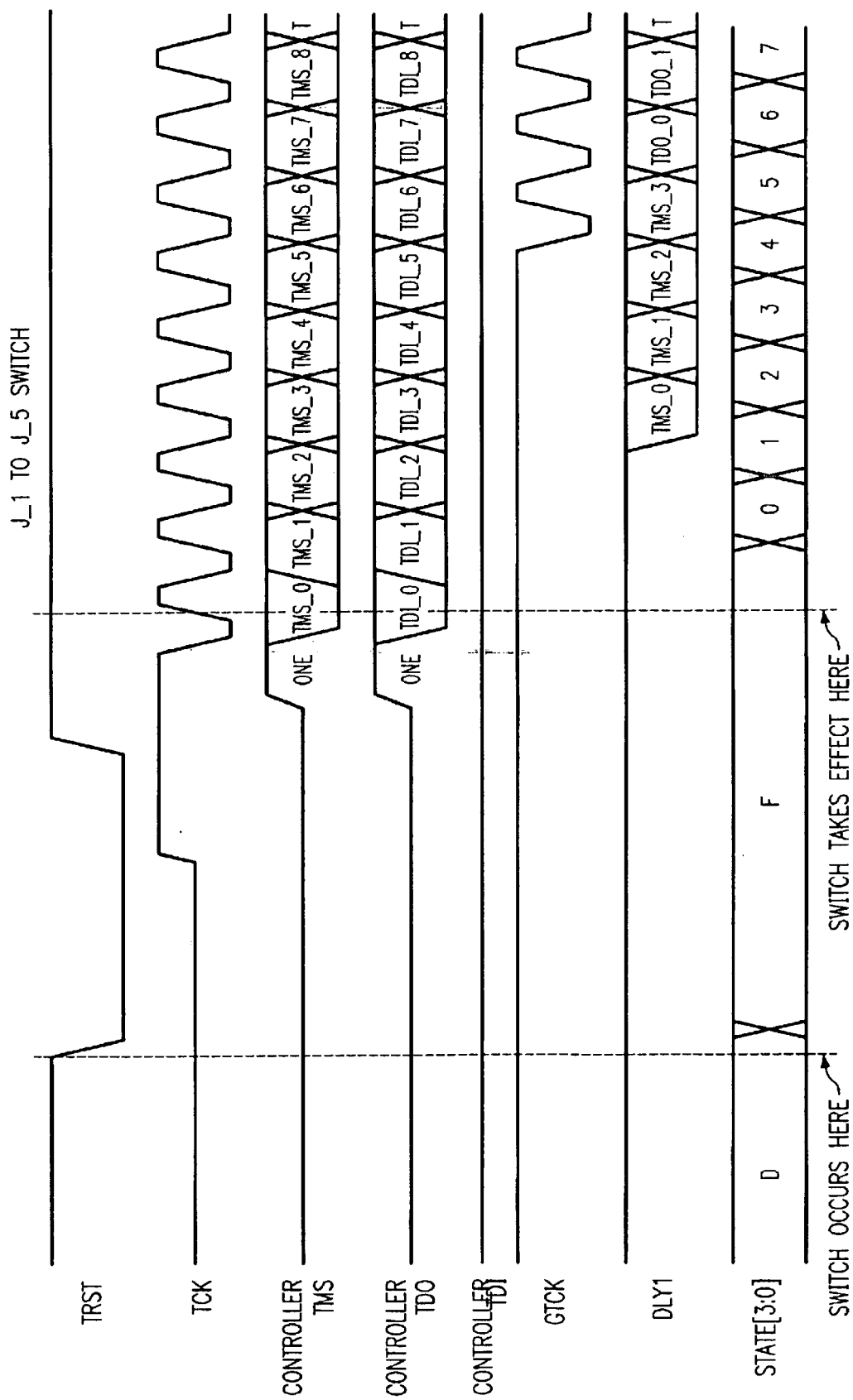

FIGS. 14–16 are timing diagrams which illustrate exemplary mode switches from J_5 to the other modes. FIGS. 17–19 are timing diagrams which illustrate exemplary mode changes from mode J_4 to the other modes. FIGS. 20–22 are timing diagrams which illustrate exemplary mode changes from mode J_3 to the other modes, and FIGS. 23–25 are timing diagrams which illustrate exemplary mode changes from mode J_1 to the other modes. In these examples, JM(0) and JM(1) are the mode bits, LSB and MSB respectively.

Figure 12:
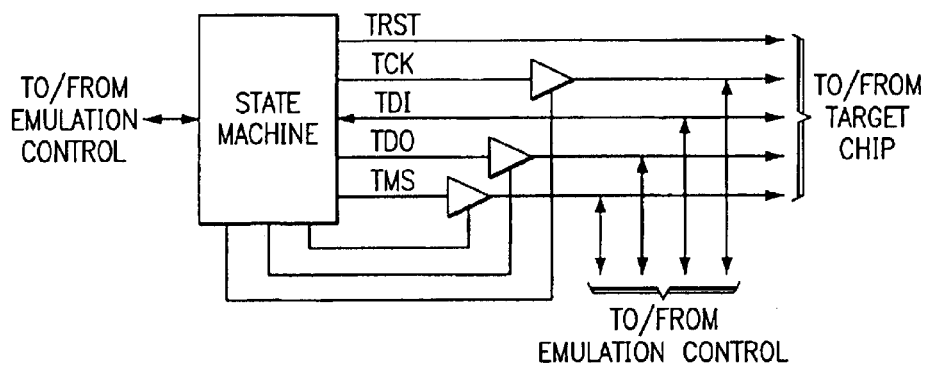
FIG. 12 diagrammatically illustrates pertinent portions of exemplary embodiments of the emulator of FIGS. 1, 2, 4 and 5.

FIG. 12 illustrates pertinent portions of exemplary embodiments of the emulator of FIG. 2, including the state machine which can perform the operations described above with respect to FIGS. 6–11. As shown in FIG. 12, the TCK, TDI, TDO and TMS connections can be used for communication of non-scan information between the emulator and the target chip, and the state machine can suitably tri-state the TMS, TDO and TCK lines when they are used for non-scan purposes.

Figure 13:
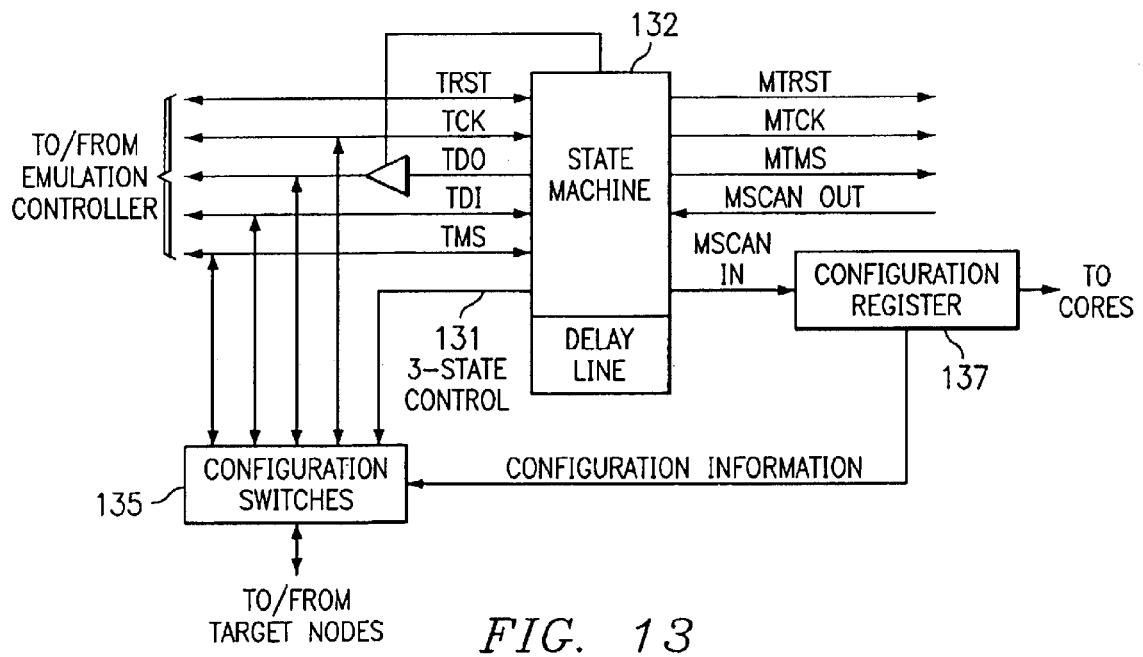
FIG. 13 diagrammatically illustrates pertinent portions of exemplary embodiments of the target device illustrated in FIGS. 1, 2, 4 and 5.

FIG. 13 diagrammatically illustrates pertinent portions of exemplary embodiments of the target device of FIGS. 2, 4 and 5. As shown in FIG. 13, the scan interface adapter of the target chip includes a state machine 132 which can perform the operations described above with respect to FIGS. 6–11, along with a delay line which delays the time division multiplexed information received from the emulator appropriately to demultiplex the time division multiplexed signals. These demultiplexed signals can then be output on their respective signal lines to the cores of the target device, as shown in FIG. 2. Also as shown in FIG. 13, the state machine 132 can tri-state the TDO output of the target device when this connection is being used for non-scan purposes.

FIG. 13 also illustrates configuration switches at 135 which permit the emulator to access desired target nodes within the target device, for example, to obtain debug information. Depending on the selected scan interface mode, the signal connections for TCK, TDO, TDI and TMS can be utilized for non-scan purposes such as debug operation. A configuration register 137 is provided in the data scan path of the target device in order to permit the emulator to scan therein configuration information which controls the configuration of the switches 135 such that the desired nodes within the target device can be accessed. The state machine also includes a tri-state control line 131 which can tri-state the outputs of the configuration switch section 135 as necessary when the associated emulator connections are being used for scan purposes.

Referring again to FIGS. 10, 11 and 14–25, when the emulator state machine enters a non-scan state, new mode information can be sent to the target device, either on the TDI pin of the target device (for J_5 or J_4 operation) or on the TDO pin of the target device (for J_3 operation). As mentioned above, in some embodiments, once the LSB has been transmitted, the MSB will always be transmitted in the next available emulator-to-target device scan information slot, whether scanned from the emulator's TDI pin to the target device's TDO pin (for modes J_4 and J_5) or from the emulator's TDI pin to the target device's TDO pin (for J_3 operation).

Also note that, in the timing diagrams of FIGS. 14–25, the DLY1 signal is the output of the delay line of FIG. 13, for example a four-bit delay line needed to delay TMS values in modes J_3 and J_4 (see also FIGS. 6 and 8). The signal GTCK is a gated version of TCK, as produced by state machine 132 to drive signal MTCK of FIG. 2 during the J_4 operations of FIGS. 6 and 7 and during the J_3 operations of FIGS. 8 and 9.

A scan interface adaptor according to other embodiments of the invention may only convert between J_3 and J_5, or between J_4 and J_5. In such exemplary embodiments, the emulator can automatically detect which conversion (if any) is supported, by trying to communicate with the target device first according to J_3 protocol, then J_4 protocol, and then J_5 protocol. The target device will respond correctly only when the correct protocol is used by the emulator.

Regarding the J_1 scan interface mode, the scan interface is actually disabled in this mode. The emulator expects the pins normally assigned to TCK, TMS, TDI, and TDO functions to be assigned to other functions such as debug functions. The state machine in the scan interface adapter is forced to state 0xF (see also FIGS. 6 and 8) while the mode is J_1. The assertion of TRST by the emulator causes the mode to change asynchronously from J_1 to the default mode (either J_3, J_4 or J_5), as shown in FIGS. 23–25.

As demonstrated above, by using time division multiplexing within a scan interface, and further by permitting the scan interface to be disabled, the present invention permits emulator-to-target device connections normally allocated to the scan interface to be selectively allocated to other desired functions, for example debug functions, which are thus overlaid on the usual scan interface functions. This advantageously provides more target device pins for desired non-scan communication with the emulator.

Although exemplary embodiments of the invention are described above in detail, this does not limit the scope of the invention, which can be practiced in a variety of embodiments.

What is claimed is:

1. A scan testable data processing apparatus comprising:
at least one scannable circuit having a test reset input for resetting a scan test chain upon receipt of a test reset signal, at least one control signal input and at least one data transfer input/output;
a scan interface adaptor having
a first port connected to said at least one scannable circuit for supplying a test reset signal to said test reset input, supplying a corresponding control signal to each of said at least one control signal input and transferring data with said at least one scannable circuit via said at least one data transfer input/output, and
a second port having a test reset pin adapted for connection to a emulator device for receiving a test reset signal, at least one further pin for connection to said emulation device,
said scan interface adaptor connecting said test reset pin of said second port to said test reset input of said at least one scannable circuit and having a first mode wherein each of said at least one control signal input and each of said at least one data transfer input/output of said at least one scannable circuit is connected to a corresponding further pin of said second port, and a second mode wherein said at least one control signal input and said at least one data transfer input/output of said at least one scannable circuit are time division multiplexed on number of said further pins of said second port less than a number of said at least one control signal input and said at least one data transfer input/output of said at least one scannable circuit; and
wherein said at least one scannable circuit and said scan interface adaptor are disposed on the same chip.

2. The scan testable data processing apparatus of claim 1, wherein:
said at least one control signal input includes a test clock input for receiving a test clock signal controlling data scan operation.

3. The scan testable data processing apparatus of claim 2, wherein:
said scan interface adaptor includes a predetermined number of said further pins and in said second mode signals of said scan testable data processing apparatus other than said test reset signal, said at least one control signal input and said at least one data transfer input/output are connected to said further pins not used by said at least one control signal input and said at least one data transfer input/output of said at least one scannable circuit.

4. The scan testable data processing apparatus of claim 2, wherein:

said scan interface adaptor includes a predetermined number of said further pins; and said scan interface adaptor further includes a third mode wherein signals of said scan testable data processing apparatus other than said test reset signal, said at least one control signal input and said at least one data transfer input/output are connected to said predetermined number of further pins, said scan interface adaptor responsive to a test reset signal on said test reset input of said second port to enter said second mode.

5. The scan testable data processing apparatus of claim 2, wherein:

said scan interface adaptor includes a predetermined number of said further pins;

said scan interface adaptor includes a plurality of second modes, each of said plurality of second modes employing a unique number of said further pins, wherein for each of said plurality of second modes a corresponding number of said at least one control signal input other than said test clock input and said at least one data transfer input/output of said at least one scannable circuit are time division multiplexed on said corresponding unique number of said further pins of said second port; and said scan interface adaptor further includes a third mode wherein signals of said scan testable data processing apparatus other than said test reset signal, said at least one control signal input and said at least one data transfer input/output are connected to said predetermined number of further pins, said scan interface adaptor responsive to a test reset signal on said test reset input of said second port to enter a predetermined one of said plurality of second modes.

6. The scan testable data processing apparatus of claim 2, wherein:

said scan interface adaptor includes a plurality of second modes, each of said plurality of second modes employing a unique number of said further pins, wherein for each of said plurality of second modes a corresponding number of said at least one control signal input other than said test clock input and said at least one data transfer input/output of said at least one scannable circuit are time division multiplexed on said corresponding unique number of said further pins of said second port; and said scan interface adaptor is further responsive to predetermined signals on said further pins of said second port to enter a corresponding one of said plurality of second modes.

7. The scan testable data processing apparatus of claim 1, wherein:

said at least one control signal input includes a test mode select input for receiving a test mode select signal to select a corresponding internal test mode of said scannable circuit.

8. The scan testable data processing apparatus of claim 1, wherein:

said at least one data transfer input/output includes a test data input for receiving test data and a test data output for transmitting test data.

9. The scan testable data processing apparatus of claim 1, wherein:

said at least one control signal input includes a test clock input for receiving a test clock signal controlling data scan operation;

said at least one control signal input includes a test mode select input for receiving a test mode select signal to select a corresponding internal test mode of said scannable circuit;

said at least one data transfer input/output includes a test data input for receiving test data and a test data output for transmitting test data; and said second mode of said scan interface adaptor connects a clock input further pin of said second port to said test clock input of said at least one scannable circuit, connects a test data output further pin of said second port to said test data output of said at least one scannable circuit and time division multiplexes said test mode select signal and said test data input signal on a further pin of said second port.

10. The scan testable data processing apparatus of claim 1, wherein:

said at least one control signal input includes a test clock input for receiving a test clock signal controlling data scan operation;

said at least one control signal input includes a test mode select input for receiving a test mode select signal to select a corresponding internal test mode of said scannable circuit;

said at least one data transfer input/output includes a test data input for receiving test data and a test data output for transmitting test data; and said second mode of said scan interface adaptor connects a clock input further pin of said second port to said test clock input of said at least one scannable circuit, and time division multiplexes said test mode select signal, said test data output of said at least one scannable circuit and said test data input signal on a further pin of said second port.

* * * * *